US010236158B2

(12) United States Patent
Kataoka et al.

(10) Patent No.: US 10,236,158 B2
(45) Date of Patent: Mar. 19, 2019

(54) HEAT TRANSFER PLATE AND WRITING APPARATUS

(71) Applicant: NUFLARE TECHNOLOGY, INC., Yokohama-shi (JP)

(72) Inventors: Kenichi Kataoka, Setagaya (JP); Mitsuhiro Okazawa, Yokohama (JP); Yoshiro Yamanaka, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/586,858

(22) Filed: May 4, 2017

(65) Prior Publication Data

US 2017/0372869 A1 Dec. 28, 2017

(30) Foreign Application Priority Data

Jun. 23, 2016 (JP) ................................. 2016-124870

(51) Int. Cl.
*H01J 37/30* (2006.01)
*H01J 37/317* (2006.01)

(52) U.S. Cl.
CPC ...... *H01J 37/3007* (2013.01); *H01J 37/3177* (2013.01); *H01J 2237/002* (2013.01)

(58) Field of Classification Search
USPC ...................................................... 250/443.1
See application file for complete search history.

(56) References Cited

U.S. PATENT DOCUMENTS

| 6,008,495 | A  | * | 12/1999 | Tanaka ..................... | G21K 5/04 |
| | | | | | 250/396 R |
| 7,345,287 | B2 | * | 3/2008 | Jasinski ................ | H01J 37/141 |
| | | | | | 165/104.33 |
| 8,368,030 | B2 | * | 2/2013 | Platzgummer ......... | B82Y 10/00 |
| | | | | | 250/306 |
| 8,754,384 | B1 | * | 6/2014 | Persoon .................. | H01J 37/20 |
| | | | | | 250/306 |

(Continued)

FOREIGN PATENT DOCUMENTS

| JP | 1-104349 | 4/1989 |
| JP | 2001-177024 | 6/2001 |
| JP | 2002-198475 | 7/2002 |

(Continued)

OTHER PUBLICATIONS

Office Action dated May 9, 2018, in Taiwanese Patent Application No. 106118318, with English-language Translation.

(Continued)

*Primary Examiner* — Phillip A Johnston
(74) *Attorney, Agent, or Firm* — Oblon, McClelland, Maier & Neustadt, L.L.P.

(57) ABSTRACT

A heat transfer plate according to the present embodiment includes a first heat transfer unit transferring heat generated in a member mounted on the first heat transfer unit, the heat being generated due to shaping or controlling of a beam generated by a light source in a decompressed atmosphere, a second heat transfer unit provided around the first heat transfer unit, and a plurality of third heat transfer units making the first heat transfer unit movable with respect to the second heat transfer unit, the plurality of third heat transfer units connecting the first and second heat transfer units.

16 Claims, 7 Drawing Sheets

(56) References Cited

U.S. PATENT DOCUMENTS 9,111,657 B2 * 8/2015 Chatoor ................ G21K 1/087
9,396,910 B2 * 7/2016 Nam ................ H01J 37/32091

FOREIGN PATENT DOCUMENTS

| JP | 2005-108960 | 4/2005 |
| JP | 2015-109323 | 6/2015 |
| TW | 367550 B | 8/1999 |

OTHER PUBLICATIONS

Office Action dated Jul. 26, 2018. in Korean Patent Application No. 10-2017-0078095 w/English Translation.

* cited by examiner

HEAT TRANSFER PLATE AND WRITING APPARATUS

CROSS REFERENCE TO RELATED APPLICATIONS

This application is based upon and claims the benefit of priority from the prior Japanese Patent Application No. 2016-124870, filed on Jun. 23, 2016, the entire contents of which are incorporated herein by reference.

FIELD

Embodiments relate to a heat transfer plate and a writing apparatus.

BACKGROUND

A photolithography technology to form circuit patterns in semiconductor devices plays an important role in advancement of the devices to have finer pitch and higher integration. A photomask used for forming such fine circuit patterns is formed with an electron beam writing technique. In the electron beam writing technique, an electron beam is applied to a mask blank to write a mask pattern, thereby forming a photomask.

For example, there is a multibeam writing apparatus using multiple beams. Compared to writing with a single electron beam, the multibeam writing apparatus can apply a lot of beams at a time, and hence improves throughput. The multibeam writing apparatus, for example, shapes an electron beam emitted from an electron gun into multiple beams through an aperture array having a plurality of holes and controls the multiple beams by blanking control to demagnify and deflect unshielded beams through an optical system, and then applies the demagnified and deflected beams to a mask blank.

The multibeam irradiation dose is controlled per beam depending on the irradiation time of each beam. Precise control of the multibeam irradiation dose requires high-speed multibeam blanking control (ON/OFF control). In order for that, the multibeam writing apparatus has a blanking aperture array mechanism having blankers arranged for respective multiple beams.

The blanking aperture array mechanism has control circuits for blanking control of respective beams and a circuit for transferring a control signal to each control circuit. The circuits become a heat source that generates heat in a writing process. In an electron beam writing apparatus, the blanking aperture array mechanism is used in vacuum. Therefore, the heat is hard to be released and may be accumulated in the blanking aperture array mechanism. In this case, there are problems of obstruction of proper blanking control due to the thermally-expanded mechanism, circuit malfunction, etc.

SUMMARY

A heat transfer plate according to an embodiment includes: a first heat transfer unit transferring heat generated in a member mounted on the first heat transfer unit, the heat being generated due to shaping or controlling of a beam generated by a light source in a decompressed atmosphere; a second heat transfer unit provided around the first heat transfer unit; and a plurality of third heat transfer units making the first heat transfer unit movable with respect to the second heat transfer unit, the plurality of third heat transfer units connecting the first and second heat transfer units.

The first to third heat transfer units may be formed with the same material.

Each of the plurality of third heat transfer units may include at least two arms and connectors, the connector connecting the arms and connecting the first or the second heat transfer unit and either one of the two arms, wherein the connector may be slenderer than the arms.

The first to third heat transfer units may be made of a plurality of material plates which are laminated, wherein, in the plurality of material plates, first members corresponding to the first heat transfer unit may be integrally joined one another, and second members corresponding to the second heat transfer unit may also be integrally joined one another, and, in the plurality of material plates, third members corresponding to the third heat transfer units may be separated from one another.

The third members, adjacent to one another in a lamination direction of the plurality of material plates, may be displaced from one another in a direction almost orthogonal to the lamination direction.

The plurality of third heat transfer units may be arranged at an almost equal interval between the first and second heat transfer units.

The first heat transfer unit may move with respect to the second heat transfer unit by deflection of the connector.

The first to third heat transfer units may be made of copper.

The heat transfer plate may further include a coupler to couple the third heat transfer units adjacent to each other.

A writing apparatus according to an embodiment includes: a stage capable of carrying a target to be processed in a decompressed atmosphere; an aperture member shaping or controlling a beam to be applied to the target to be processed; and a heat transfer plate carrying the aperture member and transferring heat generated due to shaping or controlling of the beam, wherein the heat transfer plate includes: a first heat transfer unit transferring the heat; a second heat transfer unit provided around the first heat transfer unit; and a plurality of third heat transfer units making the first heat transfer unit movable with respect to the second heat transfer unit, the plurality of third heat transfer units connecting the first and second heat transfer units.

The first to third heat transfer units may be formed with the same material.

Each of the plurality of third heat transfer units may include at least two arms and a connector, the connector connecting the arms and connecting the first or the second heat transfer unit and either one of the two arms, wherein the connector may be slenderer than the arms.

The first to third heat transfer units may be made of a plurality of material plates which are laminated, wherein, in the plurality of material plates, first members corresponding to the first heat transfer unit may be integrally joined one another, and second members corresponding to the second heat transfer unit may also be integrally joined one another, and, in the plurality of material plates, third members corresponding to the third heat transfer units may be separated from one another.

The third transfer units, adjacent to one another in a lamination direction of the plurality of material plates, may be displaced from one another in a direction almost orthogonal to the lamination direction.

The plurality of third heat transfer units may be arranged at an almost equal interval between the first and second heat transfer units.

The first heat transfer unit may move with respect to the second heat transfer unit by deflection of the connector.

The first to third heat transfer units may be made of copper.

The apparatus may further include a coupler to couple the third heat transfer units adjacent to each other.

DETAILED DESCRIPTION

Embodiments will now be explained with reference to the accompanying drawings. The present invention is not limited to the embodiments.

First Embodiment

Figure 1:
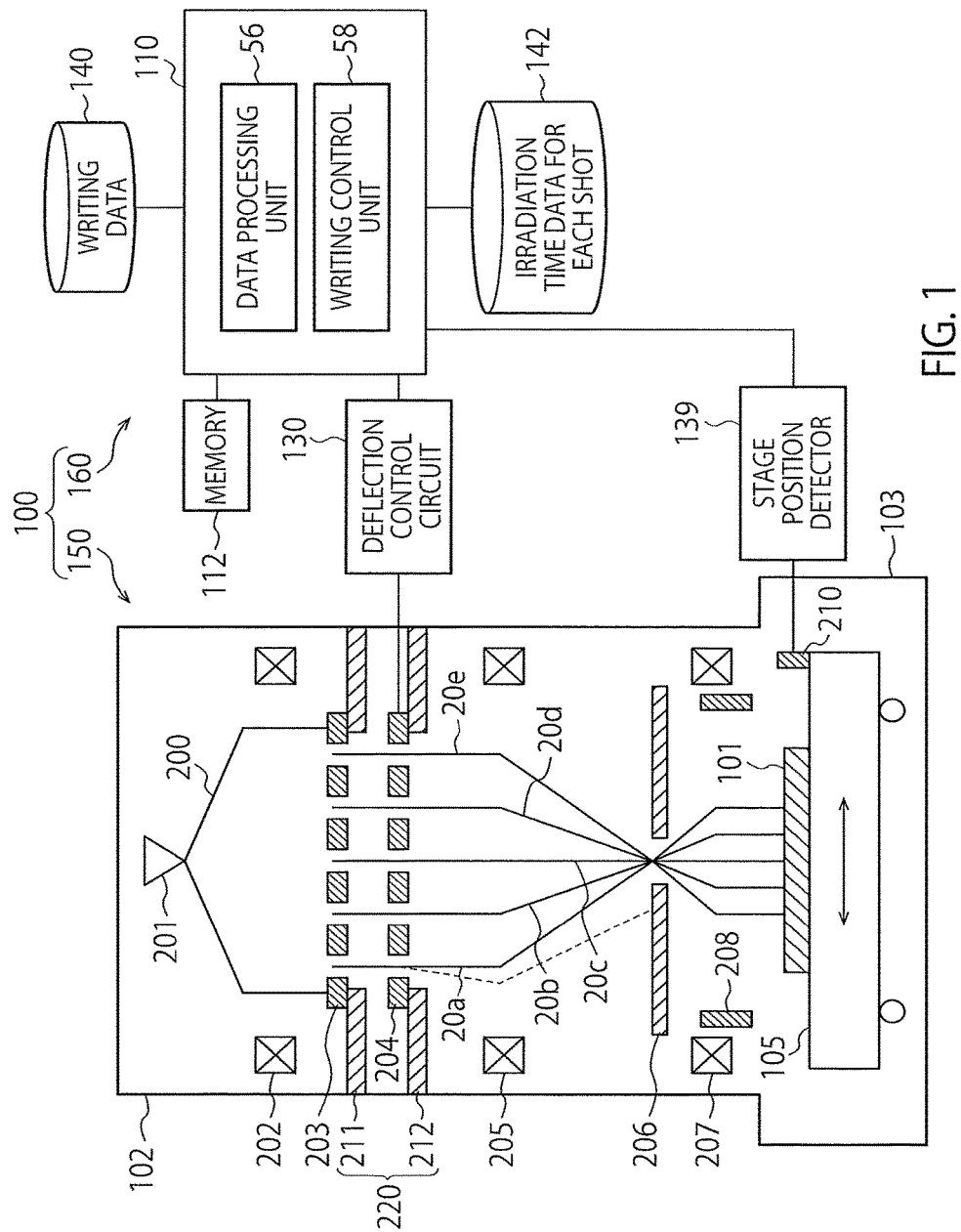
FIG. 1 is a conceptual diagram showing an example of the configuration of a writing apparatus according to a first embodiment.

FIG. 1 is a conceptual diagram showing an example of the configuration of a writing apparatus according to a first embodiment. The writing apparatus 100 is, for example, a charged electron multi-beam exposure apparatus, used for writing a photo mask in photolithography used in fabrication of semiconductor devices. Other than the writing apparatus, the present embodiment may be an apparatus for applying an electron beam, light, etc. to a target to be processed, such as an exposure apparatus, an electronic microscope, and an optical microscope. Therefore, a sample 101, as the target to be processed, may be a semiconductor substrate and the like, other than a mask blank.

The writing apparatus 100 includes a writing unit 150 and a control unit 160. The writing unit 150 includes an electron lens barrel 102 and a writing chamber 103. Arranged in the electron lens barrel 102 are an electron gun 201, an illumination lens 202, a shaping aperture array substrate 203, a blanking aperture array mechanism 204, a demagnification lens 205, a limiter 206, an objective lens 207, a deflector 208, a shaping aperture stage mechanism 211, and a blanking aperture stage mechanism 212. An X-Y stage 105 is disposed in the writing chamber 103. The X-Y stage 105 can carry the sample 101, such as a mask blank, which is a target to be processed in writing. The sample 101 may be a semiconductor substrate (silicon wafer) or the like. Disposed on the X-Y stage 105 is a mirror 210 for measuring the position of the X-Y stage 105.

A shaping aperture stage mechanism 211 is disposed in the electron lens barrel 102 and a shaping aperture array substrate 203 is mounted on the shaping aperture stage mechanism 211. Under the shaping aperture stage mechanism 211, a blanking aperture stage mechanism 212 is disposed and a blanking aperture array mechanism 204 is mounted on the blanking aperture stage mechanism 212. Hereinbelow, the overall configuration of the shaping aperture array substrate 203, the blanking aperture array mechanism 204, the shaping aperture stage mechanism 211, and the blanking aperture stage mechanism 212 is referred to as an aperture mechanism 220. In FIG. 1, the aperture mechanism 220 is only schematically shown. The detailed configuration of the aperture mechanism 220 will be explained with reference to FIG. 3.

The control unit 160 includes a control calculator 110, a memory 112, a deflection control circuit 130, a stage position detector 139, and storage units 140 and 142 such as a magnetic disk drive. The control calculator 110, the memory 112, the deflection control circuit 130, the stage position detector 139, and the storage units 140 and 142 are connected to one another via buses not shown. The storage unit 140 stores externally input writing data. The storage unit 142 stores irradiation time data for each shot.

The control calculator 110 has a data processing unit 56 and a writing control unit 58. The data processing unit 56 and the writing control unit 58 each includes a processing circuit that includes an electronic circuit, a computer, a processor, a circuit substrate, a quantum circuit, or a semiconductor device, etc. The data processing unit 56 and the writing control unit 58 may share a common processing circuit (one and the same processing circuit) or may have different processing circuits. Information input to and output from the data processing unit 56 and the writing control unit 58 and information under calculation are stored in the memory 112, for each of the input, output, and calculation.

FIG. 1 shows the components essential for explaining the first embodiment. The writing apparatus 100 may have other necessary components.

Figure 2:
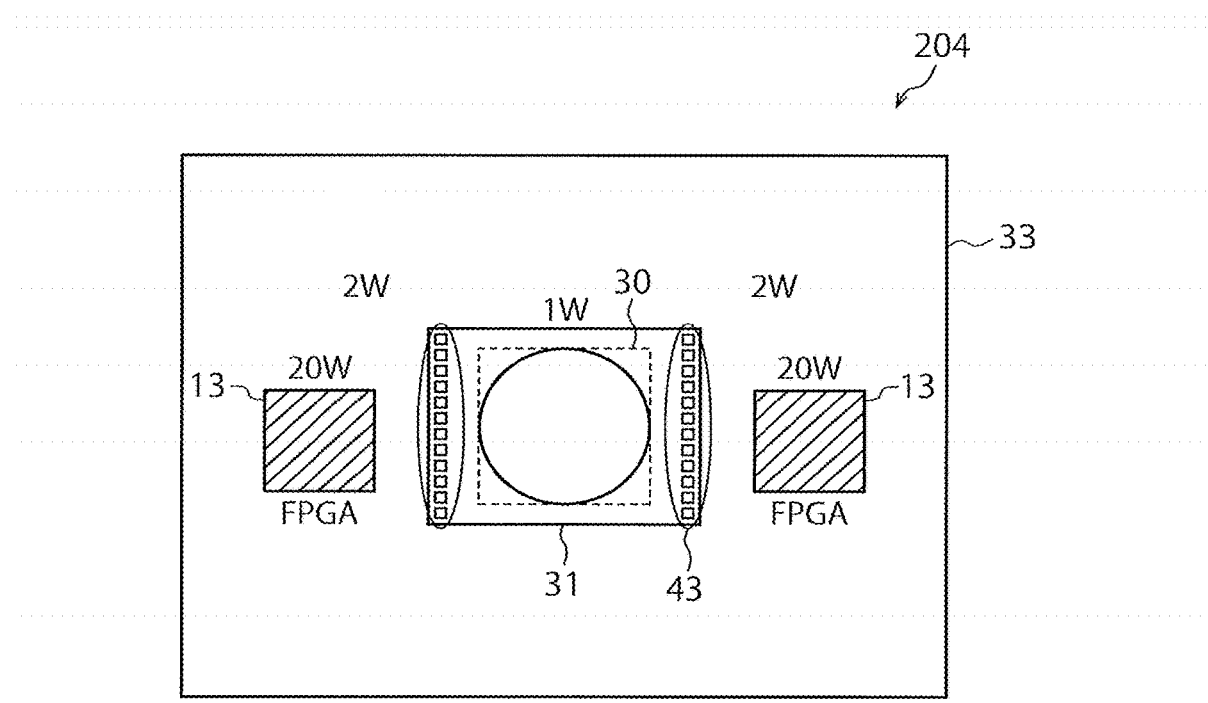
FIG. 2 is an illustration showing an example of an amount of heat generated by a blanking aperture array mechanism.

FIG. 2 is an illustration showing an example of an amount of heat generated by a blanking aperture array mechanism. A circuit substrate 33 of the blanking aperture array mechanism 204 has multiple transmission circuits 13 for transferring control signals to multiple pads 43 on a BAA (Blanking Aperture Array) chip 31. As the transmission circuits 13, for example, an FPGA (Field Programmable Gate Array) is used. The transmission circuits 13 perform buffering high-speed signals fed from the outside of the circuit substrate 33, transmission of the high-speed signals to the BAA chip 31, data error inspection, requesting data retransmission, data re-reception, etc.

In the example of FIG. 2, for example, two transmission circuits 13 are arranged with the BAA chip 31 therebetween. It is preferable that the transmission circuits 13 are arranged on the rear side of the circuit substrate 33 (mounting substrate). In the blanking aperture array mechanism 204, heat is generated from a membrane area 30 containing multiple control circuits 41, the transmission circuits 13 and other electronic components (not shown) mounted on the circuit substrate 33. The membrane area 30 generates, for example, 1 watt of heat. The transmission circuits 13 each generate, for example, 20 watts of heat, 40 watts in total on both sides of the circuit substrate 33. The other electronic components mounted on the circuit substrate 33 each generate, for example, 2 watts of heat, 4 watts in total on both sides of the circuit substrate 33. As a result, the blanking aperture array mechanism 204 as a whole generates, for example, 45 watts of heat. Accordingly, the blanking aperture array mechanism 204 itself becomes a heat source.

Figure 3:
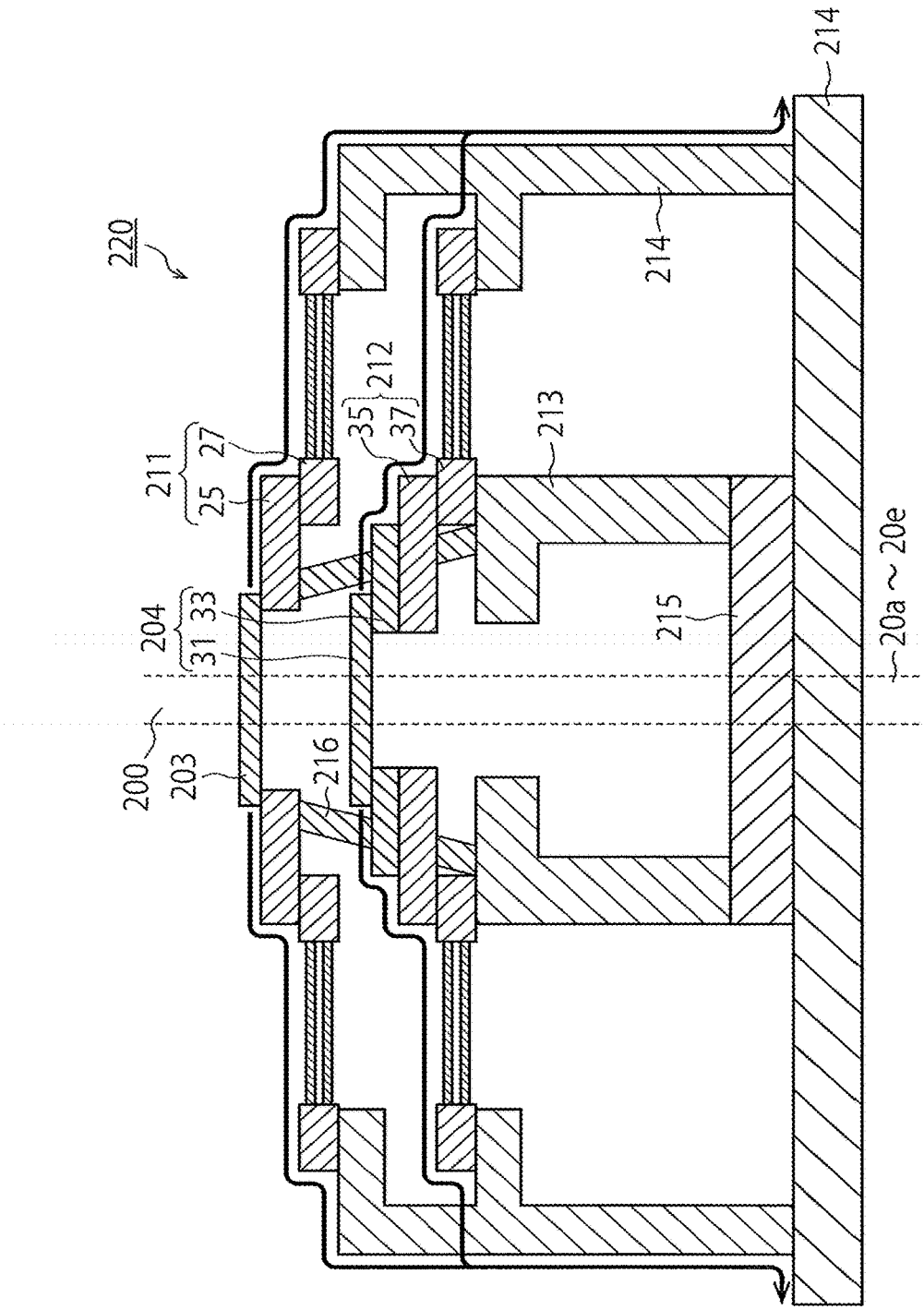
FIG. 3 is a sectional view showing an example of an aperture mechanism according to the first embodiment.

FIG. 3 is a sectional view showing an example of an aperture mechanism according to the first embodiment. In FIG. 3, arrows indicate a flow of heat. The aperture mechanism 220 includes a shaping aperture array substrate 203, a blanking aperture array mechanism 204, a shaping aperture stage mechanism 211, a blanking aperture stage mechanism 212, a transfer member 213, a heat releasing member 214, a first drive mechanism 215, and a second drive mechanism 216.

The shaping aperture array substrate 203 is fixed on the shaping aperture stage mechanism 211. The shaping aperture stage mechanism 211 has a support substrate 25 and a heat transfer plate 27. The support substrate 25 carries the shaping aperture array substrate 203 and is fixed on the heat transfer plate 27. The heat transfer plate 27 carries the shaping aperture array substrate 203 and the support substrate 25, and is fixed on the heat releasing member 214.

The shaping aperture array substrate 203 receives an electron beam 200 to generate heat, and hence can become a heat source. Therefore, the heat transfer plate 27 receives the heat from the shaping aperture array substrate 203 (heat source) via the support substrate 25 and transfers the heat to the heat releasing member 214. The heat transfer plate 27 has a flexible member to change the positions of the shaping aperture array substrate 203 and the support substrate 25 with respect to the heat releasing member 214. For example, the second drive mechanism 216 is connected to the bottom surface of the support substrate 25 to move the shaping aperture array substrate 203 and the support substrate 25. In this occasion, a part of the heat transfer plate 27 is deformed so that the shaping aperture array substrate 203 and the support substrate 25 can move with respect to the heat releasing member 214, while maintaining the ability to transfer heat. The second drive mechanism 216 is disposed between the transfer member 213 and the support substrate 25, and is configured with, for example, an actuator, such as a piezoelectric element, and an elastic stem. The actuator of the second drive mechanism 216 drives the elastic stem to adjust the positions of the shaping aperture array substrate 203 and the support substrate 25 with respect to the transfer member 213. The detailed configuration of the heat transfer plate 27 will be explained together with the configuration of the heat transfer plate 37 with respect to FIG. 4.

The blanking aperture array mechanism 204 is fixed on the blanking aperture stage mechanism 212. The blanking aperture stage mechanism 212 has a support substrate 35 and a heat transfer plate 37. The support substrate 35 carries the blanking aperture array mechanism 204 and is fixed on the heat transfer plate 37. The heat transfer plate 37 carries the blanking aperture array mechanism 204 and the support substrate 35, and is fixed on the heat releasing member 214.

The blanking aperture array mechanism 204 can become a heat source due to control of multiple beams 20a to 20e, as described above. The heat transfer plate 37 receives heat from the blanking aperture array mechanism 204 (heat source) via the support substrate 35 and transfers the heat to the heat releasing member 214. The heat transfer plate 37 has a flexible member to change the positions of the blanking aperture array mechanism 204 and the support substrate 35 with respect to the heat releasing member 214. The first drive mechanism 215 provided beneath the support substrate 35 is connected to the heat transfer plate 37 via the transfer member 213 so as to move the blanking aperture array mechanism 204 and the support substrate 35 by rotational transfer. The first drive mechanism 215 is disposed between the bottom surfaces of the heat releasing member 214 and the transfer member 213, and is configured with, for example, a rotary bearing mechanism. The first drive mechanism 215 moves the blanking aperture array mechanism 204 and the support substrate 35 by rotational transfer, via the transfer member 213 and also moves the shaping aperture array substrate 203 and the support substrate 25 by rotational transfer, via the second drive mechanism 216 connected to the transfer member 213. Accordingly, firstly, the aperture mechanism 220 rotates both of the shaping aperture array substrate 203 and the blanking aperture array mechanism 204 by means of the first drive mechanism 215 to adjust the position (rotational position) and, subsequently, adjust the position (rotational position, inclination, etc.) of the shaping aperture array substrate 203 by means of the second drive mechanism 216. Accordingly, the aperture mechanism 220 can shape desired multiple beams 20a to 20e from the electron beam 200 and perform accurate blanking control of the multiple beams 20a to 20e.

The heat releasing member 214 carries the shaping aperture array substrate 203, the shaping aperture stage mechanism 211, the blanking aperture array mechanism 204, and the blanking aperture stage mechanism 212, and is fixed with respect to the electron lens barrel 102. The heat releasing member 214 receives heat from the shaping aperture array substrate 203 and the blanking aperture array mechanism 204 via the support substrates 25 and 35, and the heat transfer plates 27 and 37, and transfers the heat to the outside of the electron lens barrel 102 to release the heat. The support substrates 25 and 35, the heat transfer plates 27 and 37, and the heat releasing member 214 are made of materials having high thermal conductivity, such as copper.

Figure 4A:
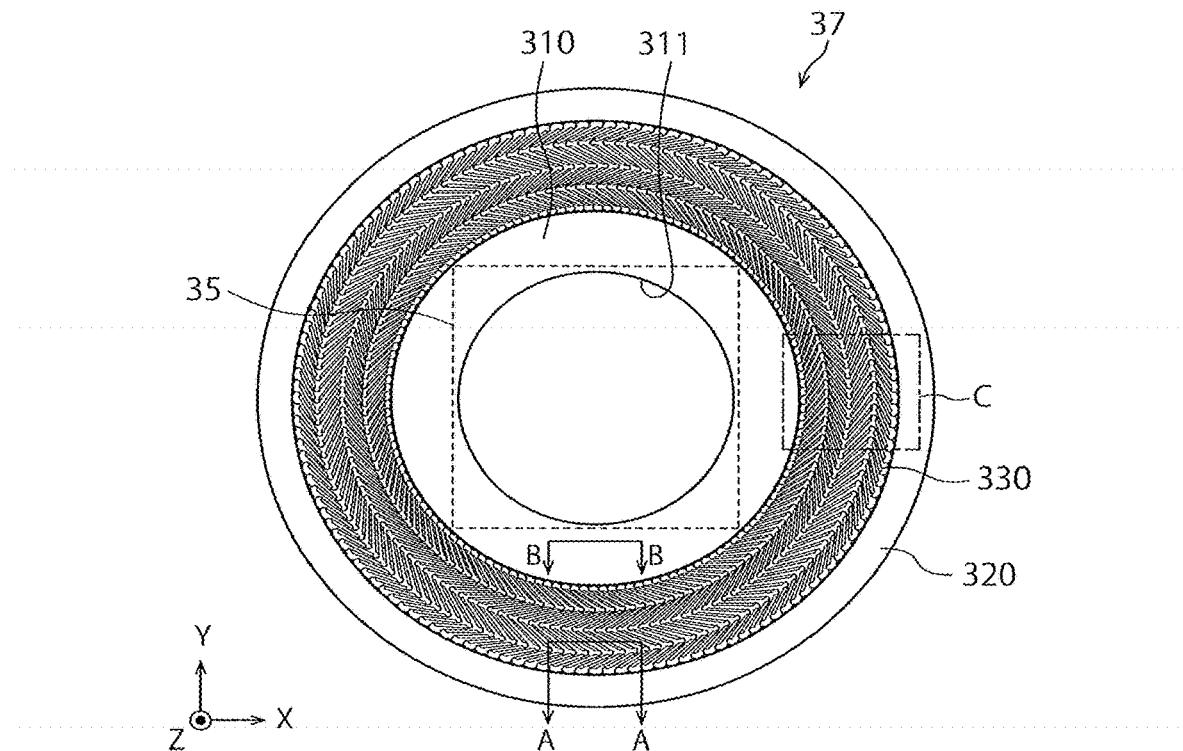
FIGS. 4A and 4B are plan views showing an example of a heat transfer plate.
Figure 4B:
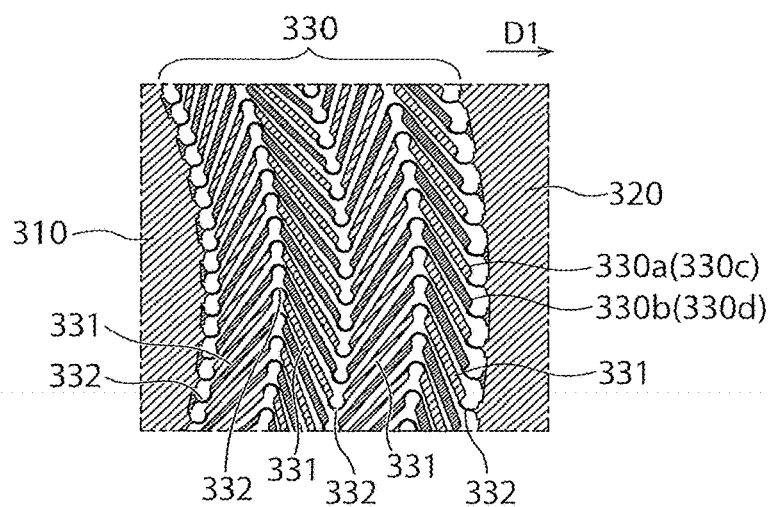

FIGS. 4A and 4B are plan views showing an example of the configuration of a heat transfer plate. FIG. 4B is an enlarged view of a frame C in FIG. 4A. The configuration of the heat transfer plate 27 may be the same as that of the heat transfer plate 37. Therefore, here, the explanation is made to the configuration of the heat transfer plate 37, while omitting the explanation of the configuration of the heat transfer plate 27.

As shown in FIG. 4A, the heat transfer plate 37 includes a first heat transfer ring 310, a second heat transfer ring 320, and multiple connection mechanisms 330.

As a first heat transfer unit, the first heat transfer ring 310 carries the support substrate 35 that supports the blanking aperture array mechanism 204 in FIG. 3. The support substrate 35 is fixed to the first heat transfer ring 310. The first heat transfer ring 310 is made of a material having high thermal conductivity, such as copper, in order to transfer heat generated due to control of the electron beam 200. Accordingly the first heat transfer ring 310 has both of the function of carrying the blanking aperture array mechanism 204 and the support substrate 35, and the function of transferring heat of the blanking aperture array mechanism 204. The first heat transfer ring 310 has an opening portion 311 at its center so that the beams 20a to 20e can pass therethrough.

As a second heat transfer unit, the second heat transfer ring 320 is provided around the first heat transfer ring 310 and is fixed to the heat releasing member 214 of FIG. 3. The second heat transfer ring 320 is formed to be larger than and to be almost a concentric circle with the first heat transfer ring 310. The second heat transfer ring 320 receives heat from the first heat transfer ring 310, transferred via the connection mechanisms 330, and transfers the heat to the heat releasing member 214. The second heat transfer ring 320 is, for example, made of a material having high thermal conductivity, such as copper.

As a third heat transfer unit, the connection mechanisms 330 connect the first heat transfer ring 310 and the second heat transfer ring 320 so as to transfer heat of the first heat transfer ring 310 to the second heat transfer ring 320. Moreover, as shown in FIG. 46, each connection mechanism 330 has arms 331 and connectors 332 to have flexibility (elasticity). With the flexibility, the first heat transfer ring 310 can move relative to the second heat transfer ring 320.

In more details, the multiple connection mechanisms 330 are arranged at an almost equal interval (an almost equal pitch) between the first heat transfer ring 310 and the second heat transfer ring 320 in the direction of the circumferences of the first and second heat transfer rings 310 and 320. With this arrangement, although each connection mechanism 330 is a slender member, the connection mechanisms 330 as a whole can transfer heat of the first heat transfer ring 310 to the second heat transfer ring 320 almost uniformly and sufficiently. Moreover, the connection mechanisms 330 are configured to move the first heat transfer ring 310 with respect to the second heat transfer ring 320 while connecting the first and second heat transfer rings 310 and 320. For example, the connection mechanism 330 can move the first heat transfer ring 310 in any direction (the directions X and Y or horizontal direction in FIG. 4A) in the plain of the second heat transfer ring 320 and also in the orthogonal direction (the direction Z in FIG. 4A) with respect to the plain of the second heat transfer ring 320. Accordingly, the connection mechanisms 330 have the function of transferring heat of the first heat transfer ring 310 to the second heat transfer ring 320 and also the function of moving the first heat transfer ring 310 relative to the second heat transfer ring 320. The connection mechanisms 330 are made of the same material (for example, copper) as the first heat transfer ring 310 and the second heat transfer ring 320.

Figure 5:
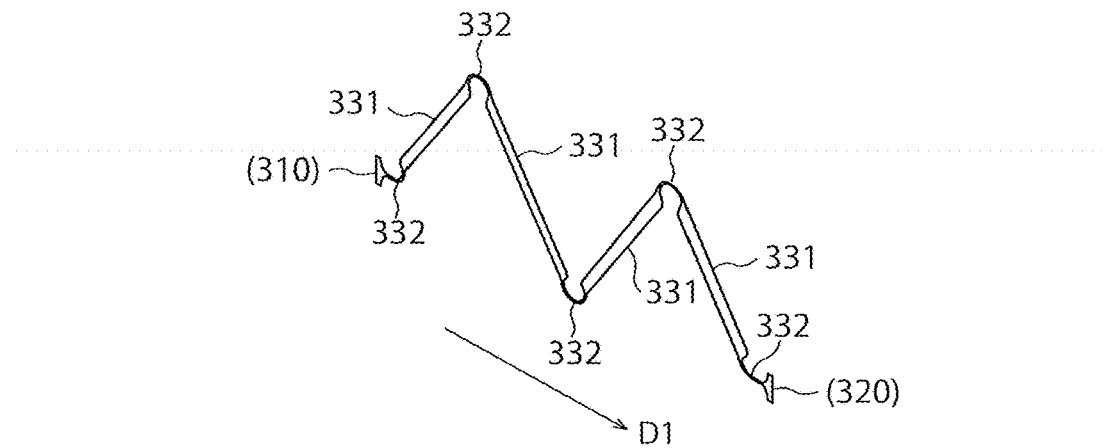
FIG. 5 is a perspective view showing an example of the configuration of one connection mechanism.

FIG. 5 is a perspective view showing an example of the configuration of one connection mechanism. As shown in FIG. 4B and FIG. 5, each connection mechanism 330 has multiple arms 331 and multiple connectors 332. The connection mechanism 330 according to the present embodiment has four arms 331 and five connectors 332. The arms 331 are wider than the connectors 332. Although each arm 331 can be deformed slightly, it is formed to transfer heat easier than each connector 332 by its large width. The arms 331 are each, for example, inclined to a direction D1 from the first heat transfer ring 310 toward the second heat transfer ring 320 and are arranged in a zigzag manner between the first and second heat transfer rings 310 and 320.

The connectors 332 are formed to be slenderer (constricted) than the arms 331 and have higher flexibility than the arms 331 so as to be able to be deformed. The connectors 332 connect the first heat transfer ring 310 and one of the arms 331, connect the arms 331 adjacent to each other, and connect one of the arms 331 and the second heat transfer ring 320. The connectors 332 serve as an elastic hinge to elastically connect the multiple arms 331 between the first heat transfer ring 310 and the second heat transfer ring 320.

For example, when the first heat transfer ring 310 moves in the direction D1, the connectors 332 shown in FIG. 4B bend (contract), so that the arms 331 incline steeply with respect to the direction D1. In other words, the arms 331 move toward a direction almost orthogonal to the direction D1. In this occasion, in the connection mechanism 330 located opposite to the frame C having the opening portion 311 therebetween, the angle between the arms 331 become larger, so that the inclination of the arms 331 become gentle with respect to the direction D1. In other words, the arms 331 move toward a direction almost parallel to the direction D1. In this way, the first heat transfer ring 310 moves in the direction D1 with respect to the second heat transfer ring 320.

On the other hand, when the first heat transfer ring 310 moves in a direction opposite to the direction D1, the angle between the arms 331 become larger, so that the inclination of the arms 331 become gentle with respect to the direction D1. In this occasion, in the connection mechanism 330 located opposite to the frame C having the opening portion 311 therebetween, the connectors 332 bend (contract), so that the inclination of the arms 331 become steep with respect to the direction D1. In other words, the arms 331 move toward a direction almost orthogonal to the direction D1. In this way, the first heat transfer ring 310 moves in a direction opposite to the direction D1 with respect to the second heat transfer ring 320. In the same manner, the first heat transfer ring 310 can move in any direction in a plain (the X-Y plain in FIG. 4A) containing the first heat transfer ring 310. Moreover, the first heat transfer ring 310 can move in the orthogonal direction (the direction Z in FIG. 4A) with respect to a plain containing the second heat transfer ring 320. Accordingly, the connection mechanisms 330 can move the first heat transfer ring 310 flexibly and three-dimensionally with respect to the second heat transfer ring 320. The moving distance of the first heat transfer ring 310 with respect to the second heat transfer ring 320 is restricted in a range in which the connection mechanisms 330 are stretchable.

In each connection mechanism 330, the arms 331 are formed to have a larger width than the connectors 332 that are to be deformed, in order to easily transfer heat. Moreover, many connection mechanisms 330 are provided between the first heat transfer ring 310 and the second heat transfer ring 320. Accordingly, the connection mechanisms 330 can move the first heat transfer ring 310 with respect to the second heat transfer ring 320, while maintaining high ability to transfer heat between the first heat transfer ring 310 and the second heat transfer ring 320.

The configuration of the connection mechanisms 330 is not limited to that shown in FIGS. 4B and 5 as long as the connection mechanisms 330 are flexible and do not lower the ability to transfer heat. For example, the number of the arms 331 and the connectors 332 is not limited to any particular number. Nevertheless, in order for the first heat transfer ring 310 to be movable with respect to the second heat transfer ring 320, it is the minimum requirement that there are two arms 331 and three connectors 332.

Figure 6A:
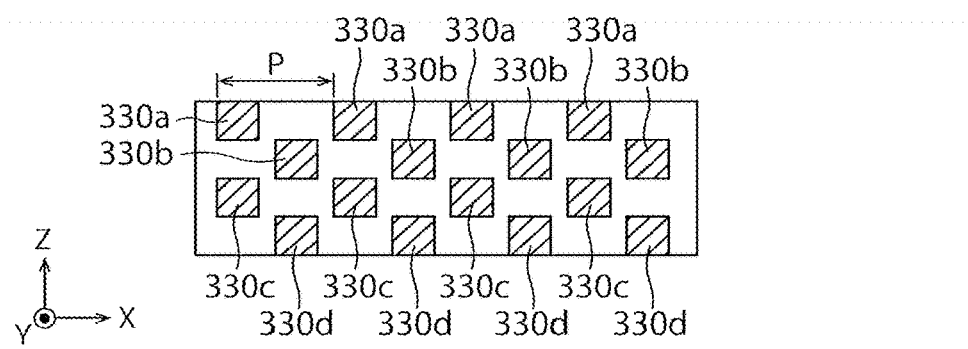
FIGS. 6A and 6B are sectional view showing an example of the configuration of a heat transfer plate.
Figure 6B:
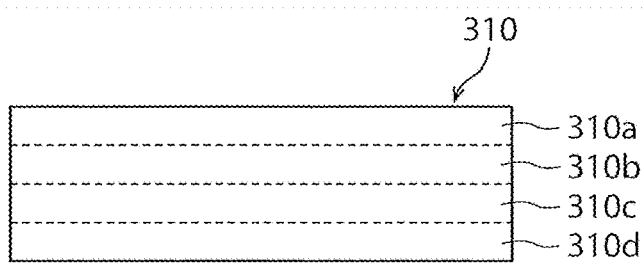
Figure 7:
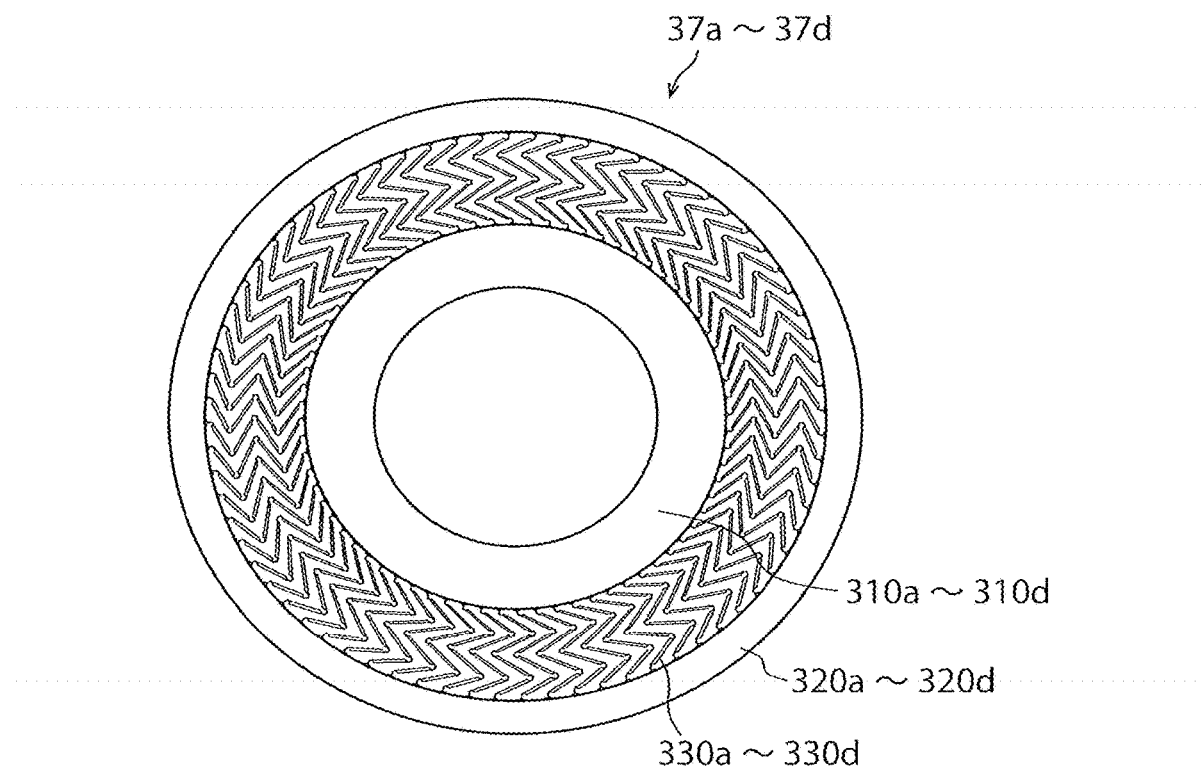
FIG. 7 is a plan view showing an example of the configuration of multiple material plates that constitute a heat transfer plate.

FIGS. 6A and 6B are sectional views showing an example of the configuration of a heat transfer plate. FIG. 6A shows a section taken along line A-A in FIG. 4A. FIG. 6B shows a section taken along line B-B in FIG. 4A. FIG. 7 is a plan view showing an example of the configuration of multiple material plates that constitute a heat transfer plate. As shown in FIGS. 6A and 6B, the heat transfer plate 37 is configured by laminating multiple material plates 37a to 37d shown in FIG. 7. Since the material plates 37a to 37d have the same configuration, FIG. 7 shows the configuration of one of the material plates 37a to 37d.

The material plates 37a to 37d, respectively, include first members 310a to 310d that correspond to the first heat transfer ring 310, second members 320a to 320d that correspond to the second heat transfer ring 320, and third members 330a to 330d that correspond to the connection mechanisms 330. The material plates 37a to 37d are, for example, thin copper plates processed with lithography and etching techniques. Therefore, each material plate 37a to 37d is formed by processing one thin plate. The first to third members 310a, 320a and 330a are processed together by integral molding to be formed into the material plate 37a. Like the material plate 37a, the first to third members 310b, 320b and 330b are processed together to be formed into the material plate 37b, the first to third members 310c, 320c and 330c are processed together to be formed into the material plate 37c and the first to third members 310d, 320d and 330d are processed together to be formed into the material plate 37d.

When the material plates 37a to 37d are laminated together, the first members 310a to 310d are jointed together by, for example, diffusion bonding or the like. In this way, as shown in FIG. 6B, the first members 310a to 310d are formed into an integrated first heat transfer ring 310. The second members 320a to 320d are also jointed together by, for example, diffusion bonding or the like. In this way, like the first heat transfer ring 310, the second members 320a to 320d are formed into an integrated second heat transfer ring 320. Not limited to diffusion bonding, the first members 310a to 310d and the second members 320a to 320d may respectively be jointed together by welding or other bonding techniques.

On the other hand, when the material plates 37a to 37d are laminated together, the third members 330a to 330d are not joined together as separated from one another. For example, as shown in FIG. 6A, the third members 330a and 330b adjacent to each other in the lamination direction (direction Z) of the material plates 37a to 37d are displaced from each other by about a half pitch in the circumference direction (a direction almost orthogonal to the direction Z (direction X in FIG. 6A) of the first and second heat transfer rings 310 and 320. The third members 330b and 330c adjacent to each other in the lamination direction are also displaced from each other by about a half pitch in the circumference direction of the first and second heat transfer rings 310 and 320. The third members 330c and 330d adjacent to each other in the lamination direction are also displaced from each other by about a half pitch in the circumference direction of the first and second heat transfer rings 310 and 320. In this way, in the cross section of FIG. 6A, the third members 330a to 330d are arranged in a staggered pattern to maintain the state of separation when the material plates 37a to 37d are laminated together. The third members 330a to 330d are formed to become the connection mechanisms 330 while being separated from one another after the lamination of the material plates 37a to 37d. One pitch P is, for example, equal to the addition of a gap between two third members 330a adjacent to each other and a width of one third member 330a in the material plate 37a.

Displacing the third members 330a to 330d from one another by half pitch (P/2), when the laminated heat transfer plate 37 is viewed in the direction Z, as shown in FIGS. 4A and 4B, each third member 330b (330d) appears between two third members 330a (330c) adjacent to each other. Therefore, the connection mechanisms 330 of the heat transfer plate 37 shown in FIG. 4A are arranged at higher density than the third members (for example, 330a) of one material plate (for example, 37a) of FIG. 7. In this way, the connection mechanisms 330 of the heat transfer plate 37 can be formed at high density while being separated from one another.

As described above, in the heat transfer plate 37 according to the present embodiment, the first heat transfer ring 310 and the second heat transfer ring 320 are each formed into an integrated joined body and the third members 330a to 330d of the connection mechanisms 330 are separated from one another. The first heat transfer ring 310 formed into an integrated joined body has rigidity that is almost equal to the rigidity of one plate having a thickness equal to the total thickness of the first members 310a to 310d. In general, the flexural rigidity (hard to bend) is in proportional to the third power of a material thickness. Therefore, the first heat transfer ring 310 has extremely high rigidity compared to the total rigidity of the first members 310a to 310d. Likewise, the second heat transfer ring 320 has almost the same rigidity as the rigidity of one plate having the same thickness as the total thickness of the second members 320a to 320d. Therefore, the second heat transfer ring 320 also has extremely high rigidity compared to the total rigidity of the second members 320a to 320d. On the other hand, since the third members 330a to 330d of each connection mechanism 330 are separated from one another, the rigidity of connection mechanism 330 is equal to a simple sum of the rigidity of the third members 330a to 330d. Therefore, the connection mechanism 330 has flexibility (elasticity). As described above, in the heat transfer plate 37 according to the present embodiment, the rigidity of the first and second heat transfer rings 310 and 320, and the flexibility of the connection mechanisms 330 can be consistent with each other.

Moreover, according to the present embodiment, as shown in FIG. 6A, the third members 330a to 330d adjacent to one another in the circumference direction of the first and second heat transfer rings 310 and 320 are displaced from one another by a half pitch (P/2). With this arrangement, entangling between the connection mechanisms 330 can be avoided while the connection mechanisms 330 have high density or large cross section. Having high density or large cross section, the connection mechanisms 330 can maintain high ability to transfer heat between the first heat transfer ring 310 and the second heat transfer ring 320. The high ability to transfer heat can reduce the thermal expansion of the shaping aperture array substrate 203 or the blanking aperture array mechanism 204, which leads to improved writing accuracy. Moreover, cooling of the blanking aperture array mechanism 204 helps to improve throughput in a writing process.

In the present embodiment, the heat transfer plate 37 is formed by laminating four material plates 37a to 37d. However, the number of the laminated material plates that constitute the heat transfer plate 37 may be smaller than four, or equal to or larger than five. For example, each heat transfer plate 37 may be formed by laminating 20 material plates each having a thickness of about 0.25 mm. In this case, the total thickness of the heat transfer plate 37 is about 5 mm.

Second Embodiment

Figure 8:
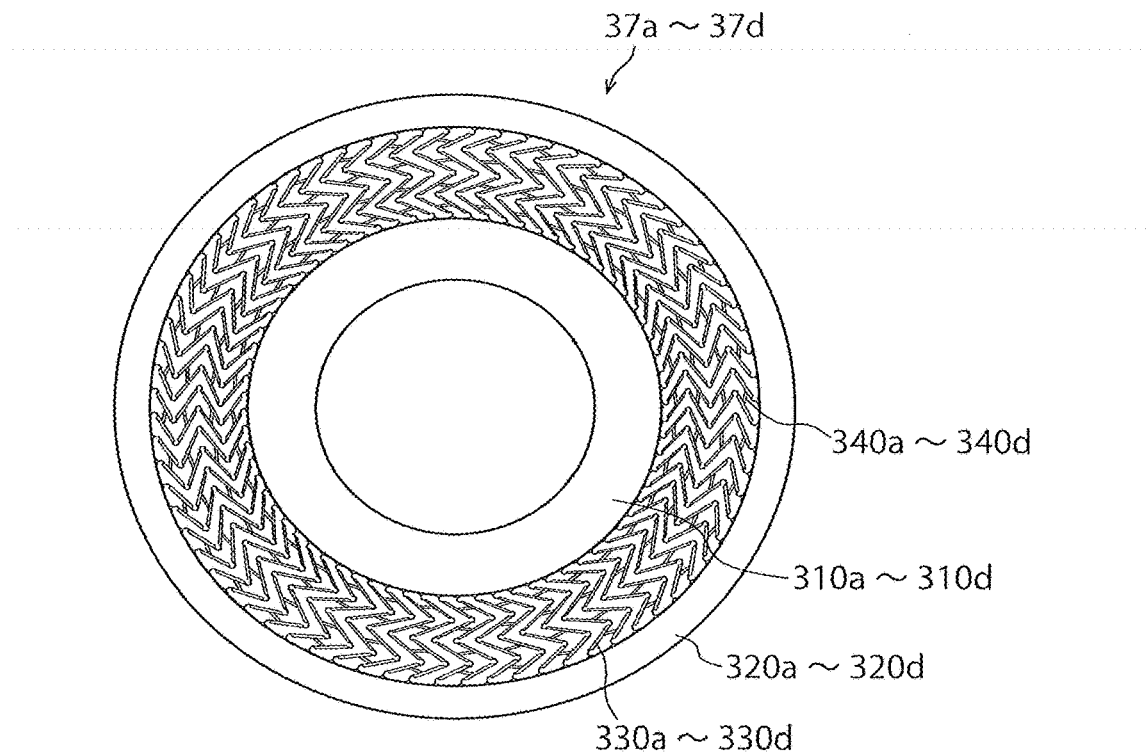
FIG. 8 is a plan view showing an example of the configuration of a material plate according to a second embodiment.

FIG. 8 is a plan view showing an example of the configuration of material plates 37a to 37d according to a second embodiment. Since the material plates 37a to 37d have the same configuration, FIG. 8 shows one of the material plates 37a to 37d. The material plates 37a to 37d of the second embodiment are the same as the material plates 37a to 37d of the first embodiment, on the point of including the first members 310a to 310d, the second members 320a to 320d, and the third members 330a to 330d, respectively. However, the material plates 37a to 37d of the second embodiment are different from the material plates 37a to 37d of the first embodiment, on the point of including couplers 340a to 340d, respectively.

The couplers 340a couple the third members 330a adjacent to one another in the circumference direction of the first and second members 310a and 320a. Likewise, the couplers 340b couple the third members 330b adjacent to one another in the circumference direction of the first and second members 310b and 320b. The couplers 340c couple the third members 330c adjacent to one another in the circumference direction of the first and second members 310c and 320c. Furthermore, the couplers 340d couple the third members 330d adjacent to one another in the circumference direction of the first and second members 310d and 320d. Moreover, the couplers 340a couple the third members 330a for every particular number of the members (for example, every second ones). That is, the couplers 340a couple the third members 330a, intermittently. Likewise, the couplers 340b couple the third members 330b for every particular number of the members (intermittently). The couplers 340c couple the third members 330c for every particular number of the members (intermittently). Moreover, the couplers 340d couple the third members 330d for every particular number of the members (intermittently). In this way, the couplers 340a to 340d couple a plural number of the third members 330a to 330d adjacent to one another, respectively. With this arrangement, entangling the third members 330a, 330b, 330c and/or 330d each other can be avoided while the third members 330a maintain flexibility.

In the heat transfer plate 37 having the laminated material plates 37a to 37d, the couplers 340a to 340d couple the third members 330 adjacent to one another in the circumference direction of the first and second members 310 and 320. With this arrangement, entangling the third members 330 next to each other can be avoided. Moreover, the second embodiment can exhibit the same effect as the first embodiment.

In FIG. 8, the couplers 340a couple every pair of the third members 330a, which is the same for the couplers 340b to the third members 330b, the couplers 340c to the third members 330c, and the couplers 340d to the third members 330d. However, the number of the third members 330a coupled by the couplers 340a is not limited to a particular number, which is the same for the third members 330b coupled by the couplers 340b, the third members 330c coupled by the couplers 340c, and the third members 330d coupled by the couplers 340d. Therefore, the coupler 340a may link every triplet or more of the third members 330a, which is the same for the couplers 340b to the third members 330b, the couplers 340c to the third members 330c, and the couplers 340d to the third members 330d. Even in this arrangement, the second embodiment still exhibits the effect mentioned above.

Modification

Figure 9:
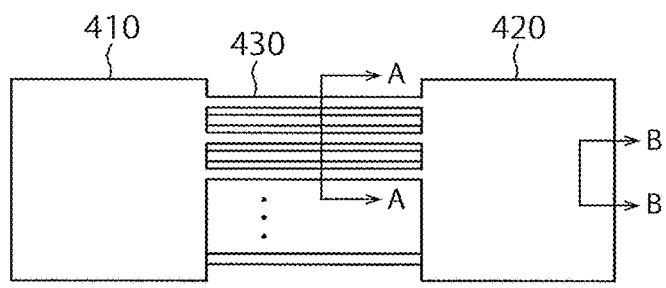
FIG. 9 is a plan view showing the configuration of a heat transfer plate according to a modification.

FIG. 9 is a plan view showing the configuration of a heat transfer plate according to a modification. In the heat transfer plate 37 according to the first and second embodiments, the first and second heat transfer rings 310 and 320, as the first and second heat transfer units, respectively, are ring members arranged concentric with each other. However, the first and second heat transfer units may not be a ring member but may be arranged in parallel. For example, in the modification, a first heat transfer unit 410 and a second heat transfer unit 420 are rectangular members arranged in parallel. A third heat transfer unit 430 is connected the first and second heat transfer units 410 and 420.

The first to third heat transfer units 410 to 430 have the same configurations as those explained with reference to FIG. 5 to FIG. 6B. Therefore, the first and second heat transfer units 410 and 420 have the configuration in section (a section taken along line B-B in FIG. 9) shown in FIG. 6B. The third heat transfer unit 430 has the configuration shown in FIG. 5. FIG. 9 schematically shows the third heat transfer unit 430. The third heat transfer unit 430 has the configuration in section (a section taken along line A-A in FIG. 9) shown in FIG. 6A. The explanation of the detailed configurations of the first to third heat transfer units 410 to 430 is omitted.

As described above, the first and second heat transfer units may not be a ring member but may be arranged in parallel.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A heat transfer plate comprising:
a first heat transfer unit transferring heat generated in a member on the first heat transfer unit, the heat being generated due to shaping or controlling of a beam in vacuum;
a second heat transfer unit provided around the circumference of the first heat transfer unit; and
a plurality of third heat transfer units making the first heat transfer unit movable with respect to the second heat transfer unit, the plurality of third heat transfer units connecting the first and second heat transfer units, the third heat transfer units being coupled with the first and second heat transfer units integrally in a direction of circumferences of both of the first and second heat transfer units, the plurality of third heat transfer units having flexibility,
wherein each of the plurality of third heat transfer units comprises at least two arms and connectors, the connector connecting the arms and connecting the first or the second heat transfer unit and either one of the two arms,
wherein the connector is slenderer than the arms.

2. The heat transfer plate according to claim 1, the first to third heat transfer units are formed with the same material.

3. The heat transfer plate according to claim 1, wherein the first to third heat transfer units are made of a plurality of material plates which are laminated,
wherein, in the plurality of material plates, first members corresponding to the first heat transfer unit are integrally joined one another, and second members corresponding to the second heat transfer unit are also integrally joined one another, and in the plurality of material plates, third members corresponding to the third heat transfer units are separated from one another.

4. The heat transfer plate according to claim 3, wherein the third members, adjacent to one another in a lamination direction of the plurality of material plates, are displaced from one another in a direction almost orthogonal to the lamination direction.

5. The heat transfer plate according to claim 1, wherein the plurality of third heat transfer units are arranged at an almost equal interval between the first and second heat transfer units.

6. The heat transfer plate according to claim 1, wherein the first heat transfer unit moves with respect to the second heat transfer unit by deflection of the connector.

7. The heat transfer plate according to claim 1, wherein the first to third heat transfer units are made of copper.

8. The heat transfer plate according to claim 1 further comprising a coupler to couple the third heat transfer units adjacent to each other.

9. A writing apparatus comprising:
a stage capable of carrying a target to be processed in vacuum;
an aperture member shaping or controlling a beam to be applied to the target to be processed; and
a heat transfer plate carrying the aperture member and transferring heat generated due to shaping or controlling of the beam,
wherein the heat transfer plate comprises:
a first heat transfer unit transferring the heat;
a second heat transfer unit provided around the circumference of the first heat transfer unit; and
a plurality of third heat transfer units making the first heat transfer unit movable with respect to the second heat transfer unit, the plurality of third heat transfer units connecting the first and second heat transfer units, the third heat transfer units being coupled with the first and second heat transfer units integrally in a direction of circumferences of both of the first and second heat transfer units, the plurality of third heat transfer units having flexibility,
wherein each of the plurality of third heat transfer units comprises at least two arms and a connector, the connector connecting the arms and connecting the first or the second heat transfer unit and either one of the two arms,
wherein the connector is slenderer than the arms.

10. The writing apparatus according to claim 9, the first to third heat transfer units are formed with the same material.

11. The writing apparatus according to claim 9, wherein the first to third heat transfer units are made of a plurality of material plates which are laminated,
wherein, in the plurality of material plates, first members corresponding to the first heat transfer unit are integrally joined one another, and second members corresponding to the second heat transfer unit are also integrally joined one another, and, in the plurality of material plates, third members corresponding to the third heat transfer units are separated from one another.

12. The writing apparatus according to claim 11, wherein the third transfer units, adjacent to one another in a lamination direction of the plurality of material plates, are displaced from one another in a direction almost orthogonal to the lamination direction.

13. The writing apparatus according to claim 9, wherein the plurality of third heat transfer units are arranged at an almost equal interval between the first and second heat transfer units.

14. The writing apparatus according to claim 9, wherein the first heat transfer unit moves with respect to the second heat transfer unit by deflection of the connector.

15. The writing apparatus according to claim 9, wherein the first to third heat transfer units are made of copper.

16. The writing apparatus according to claim 9 further comprising a coupler to couple the third heat transfer units adjacent to each other.

* * * * *